US005532437A

United States Patent [19]

Simplicean et al.

[11] Patent Number: 5,532,437

[45] Date of Patent: Jul. 2, 1996

[54] SPEAKER ASSEMBLY

[75] Inventors: Ionel E. Simplicean, Dearborn Hgts.; Sorin Stancu, Detroit, both of Mich.

[73] Assignee: Ford Motor Company, Dearborn, Mich.

[21] Appl. No.: 466,508

[22] Filed: Jun. 6, 1995

[51] Int. Cl.[6] .................... H05K 5/00

[52] U.S. Cl. .................... 181/150; 181/141

[58] Field of Search .................... 181/150, 141, 181/199; 381/86, 188, 205

[56] References Cited

U.S. PATENT DOCUMENTS

| | | | |
|---|---|---|---|
| 2,115,098 | 4/1938 | Engholm | 181/150 |
| 4,122,911 | 10/1978 | Croup . | |
| 4,136,755 | 1/1979 | Goes . | |
| 4,281,224 | 7/1981 | Castagna | 181/150 X |
| 4,572,326 | 2/1986 | Hutchins . | |
| 4,790,407 | 12/1988 | Yamamoto et al. . | |
| 4,847,907 | 7/1989 | Ando . | |
| 4,905,860 | 3/1990 | Kurihara et al. . | |
| 4,928,788 | 5/1990 | Erickson . | |
| 4,993,510 | 2/1991 | Kato et al. | 181/141 |

OTHER PUBLICATIONS

*Encyclopedia of Electronics and Computers* 471–477 (Sybil P. Parker ed., 1984).

*Primary Examiner*—Khanh Dang
*Attorney, Agent, or Firm*—Damian Porcari; Roger L. May

[57] ABSTRACT

A speaker assembly for a motor vehicle is provided in which the speaker is mounted to a blow molded enclosure so as to mimimize vibration of the enclosure. The speaker includes a back plate and a frame with a peripheral flange. The enclosure has front and rear wall portions, the front wall portion defining an opening for receiving the speaker. Adjacent the opening, the front wall portion has a planar sealing surface for supporting the flange. A gasket is provided intermediate the flange and the sealing surface. A fastener extends through the rear wall portion and engages the back plate of the speaker. The fastener draws the flange towards the sealing surface and compresses the gasket. The speaker spaces the rear wall portion a fixed distance from the front wall portion. A flat speaker wire conveniently extends into the enclosure through the same opening that receives the speaker.

18 Claims, 2 Drawing Sheets

Fig-1
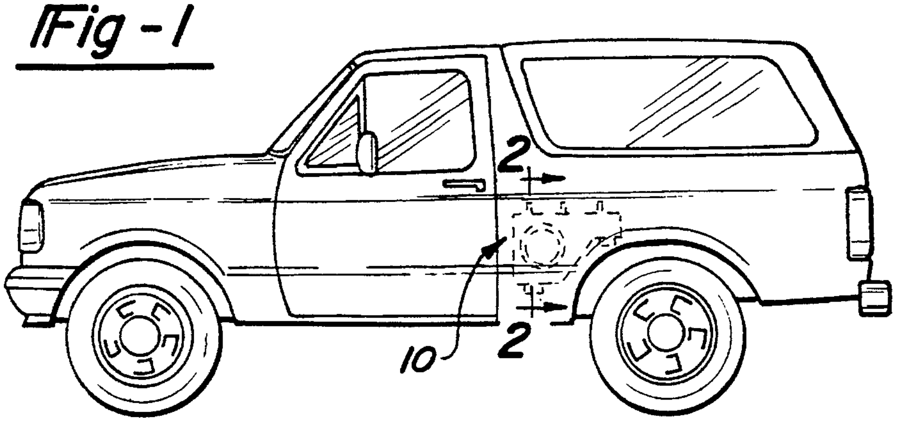
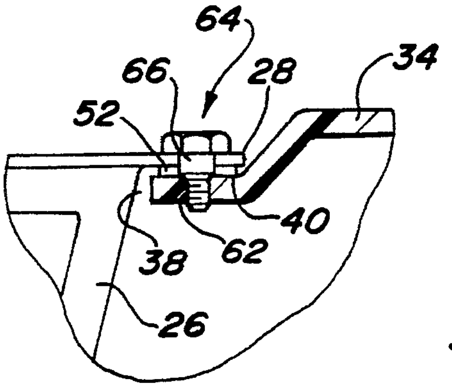
Fig-3A
Fig-3B
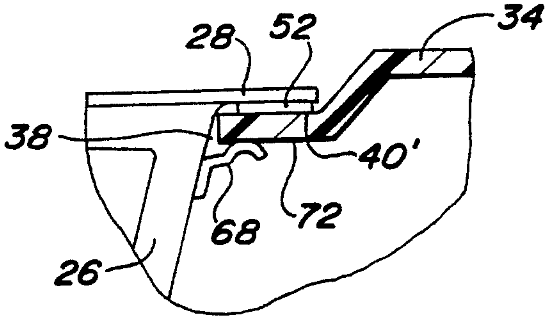
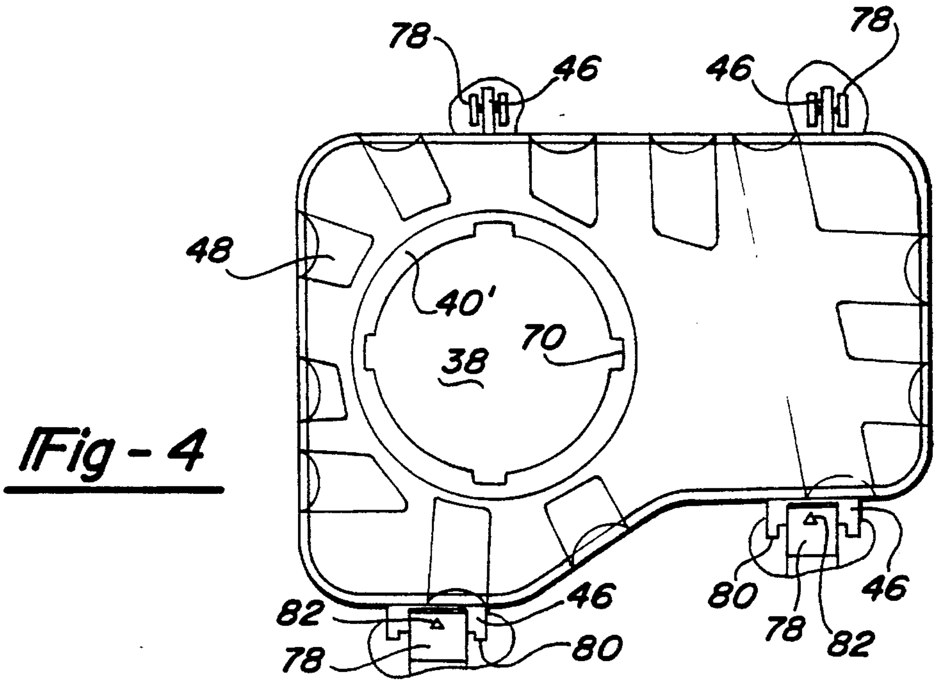
Fig-4

SPEAKER ASSEMBLY

BACKGROUND OF THE INVENTION

1. Field of the Invention

This invention relates to a speaker assembly for a motor vehicle. More particularly, the invention relates to an automotive speaker assembly in which the speaker is mounted to a blow molded enclosure so as to minimize vibration of the enclosure. The invention also relates to an automotive speaker assembly having a speaker wire which extends into the enclosure through the same opening that receives the speaker.

2. Description of Related Art

High performance automotive speakers are typically mounted within plastic speaker enclosures such that sound waves radiating from the front of the speaker diaphragm enter the passenger compartment of the vehicle while sound waves emanating from the back of the speaker diaphragm enter the enclosure. For an automotive speaker to deliver accurate sound reproduction, especially in the low frequency ranges, it is important that the speaker enclosure be rigid enough to resist vibrating in response to the motion of the vehicle and the sound waves generated by the back of the speaker diaphragm. This rigidity requirement represents a significant design challenge in the manufacture of light weight, low cost speaker enclosures. Whereas thin-walled enclosures are desirable from a cost and weight standpoint, care must be taken to ensure that the enclosure walls are adequately reinforced against vibration so that the sound quality of the system is not compromised.

Conventional automotive speaker enclosures are made from injection molded plastic material. The injection molding process allows the thickness of the enclosure walls to be varied such that thicker wall sections may be provided in areas of the enclosure that would otherwise be susceptible to vibration. It is also possible to reinforce injection molded enclosures by providing internal hollow columns, or kiss offs, between the front and rear enclosure walls. Despite the design flexibility offered by injection molding, however, the method has several drawbacks with respect to speaker enclosure manufacture. Tooling and material costs, for example, are relatively high, and additional fabrication and sealing costs are incurred in assembling the enclosure from separately molded pieces. Moreover, it is difficult to ensure an airtight seal between the enclosure pieces because of part shrinkage and the irregular shape of most speaker enclosure designs. In the absence of an airtight seal between the pieces, the speaker enclosure will not function as intended.

Each of the above drawbacks may be overcome through the use of blow molded speaker enclosures. Blow molding tooling and equipment is generally much less expensive than injection molding tooling and equipment, and low cost materials, such as polyethylene, may be used. Furthermore, since blow molded enclosures are one-piece integral structures, no post-mold assembly and sealing operation is required, and the potential for air leakage is reduced.

Blow molded enclosures, like injection molded enclosures, are desirably reinforced against vibration. Because it would be difficult to form a blow molded enclosure having internal kiss offs, or walls of closely-controlled varying thickness, however, other methods for reinforcing the blow molded enclosure must be used. U.S. Pat. No. 4,905,860 to Kurihara et al. discloses one such method, wherein U-shaped ribs are provided on flat regions of the front and back surfaces of a vented, blow molded enclosure to improve its rigidity. Such surface ribs may not provide adequate reinforcement against vibration, however, especially for very thin-walled or unvented enclosures. It would therefore be desirable to provide another mechanism for reinforcing the walls of blow molded speaker enclosures.

A need also exists for an improved wiring system for automotive speaker assemblies. In the present system, a conventional round 16 to 18 gauge speaker wire must be threaded through an aperture in one of the enclosure walls to electrically connect the speaker to an amplifier located outside of the enclosure. Where a vented enclosure is used, the wire may be passed through the vent, but where an unvented enclosure is used, a special aperture for the wire must be provided in the enclosure wall. In either case, the need to thread the wire through the enclosure prevents the installation of the speaker and amplifier as a single, preconnected and pretested unit. The threading operation also adds to the complexity of the assembly process and increases the cycle time. For speaker assemblies having unvented enclosures, the time, expense and complexity of the assembly process is further increased by the need to seal the aperture around the speaker wire. Given these difficulties associated with the conventional wiring system, it would be desirable to provide a speaker assembly having simple and economical means for electrically connecting the speaker to the amplifier.

SUMMARY OF THE INVENTION

The present invention provides a speaker assembly for a motor vehicle which overcomes the above-described disadvantages of the prior art. The assembly includes a speaker and a blow molded speaker enclosure. The speaker has a back plate and a frame with a peripheral flange. The enclosure includes front and rear wall portions, the front wall portion defining an opening for receiving the speaker. Adjacent the opening, the front wall portion has a planar sealing surface for supporting the flange. A gasket is provided intermediate the flange and the sealing surface. A fastener extends through the rear wall portion and engages the back plate of the speaker. The fastener draws the flange towards the sealing surface and compresses the gasket. The speaker spaces the rear wall portion a fixed distance from the front wall portion.

In another embodiment of the present invention, the speaker assembly includes a flat speaker wire which extends into the enclosure between the flange and the sealing surface. The wire electrically connects the speaker to an amplifier or other external signal source.

The present invention enables the front and rear walls of a blow molded enclosure to be fixed relative to one another simply and reliably, without the use of molded-in columns or kiss offs. Further, the invention decreases the assembly time and eliminates the costs associated with threading a speaker wire through a vent or special aperture provided in the enclosure wall. The present invention also makes possible the installation of a preconnected and pretested speaker-amplifier unit. These and other benefits of the present invention are more fully described below.

BRIEF DESCRIPTION OF THE DRAWINGS

FIG. 1 is a side view of a vehicle having a speaker assembly, shown in phantom, installed in its rear quarter panel.

FIG. 3A is a partial cross-sectional view of the area labeled 3 in FIG. 2, showing one embodiment of the present invention.

FIG. 3B is a partial cross-sectional view of the area labeled 3 in FIG. 2, showing an alternative embodiment of the present invention.

FIG. 4 shows a plan view of an enclosure having a speaker opening corresponding to the embodiment of the invention illustrated in FIG. 3B.

DETAILED DESCRIPTION OF THE PREFERRED EMBODIMENTS

FIG. 1 shows a speaker assembly 10, in phantom lines, mounted in an automotive vehicle. As illustrated, speaker assembly 10 is shaped to fit in front of the rear wheel well in the rear quarter panel of the vehicle. Alternatively, speaker assembly 10 may be designed for installation in other suitable locations within the vehicle, such as for example, behind the rear wheel well or underneath the rear package shelf. A trim panel (not shown) generally separates speaker assembly 10 from the passenger compartment of the vehicle.

Figure 2:
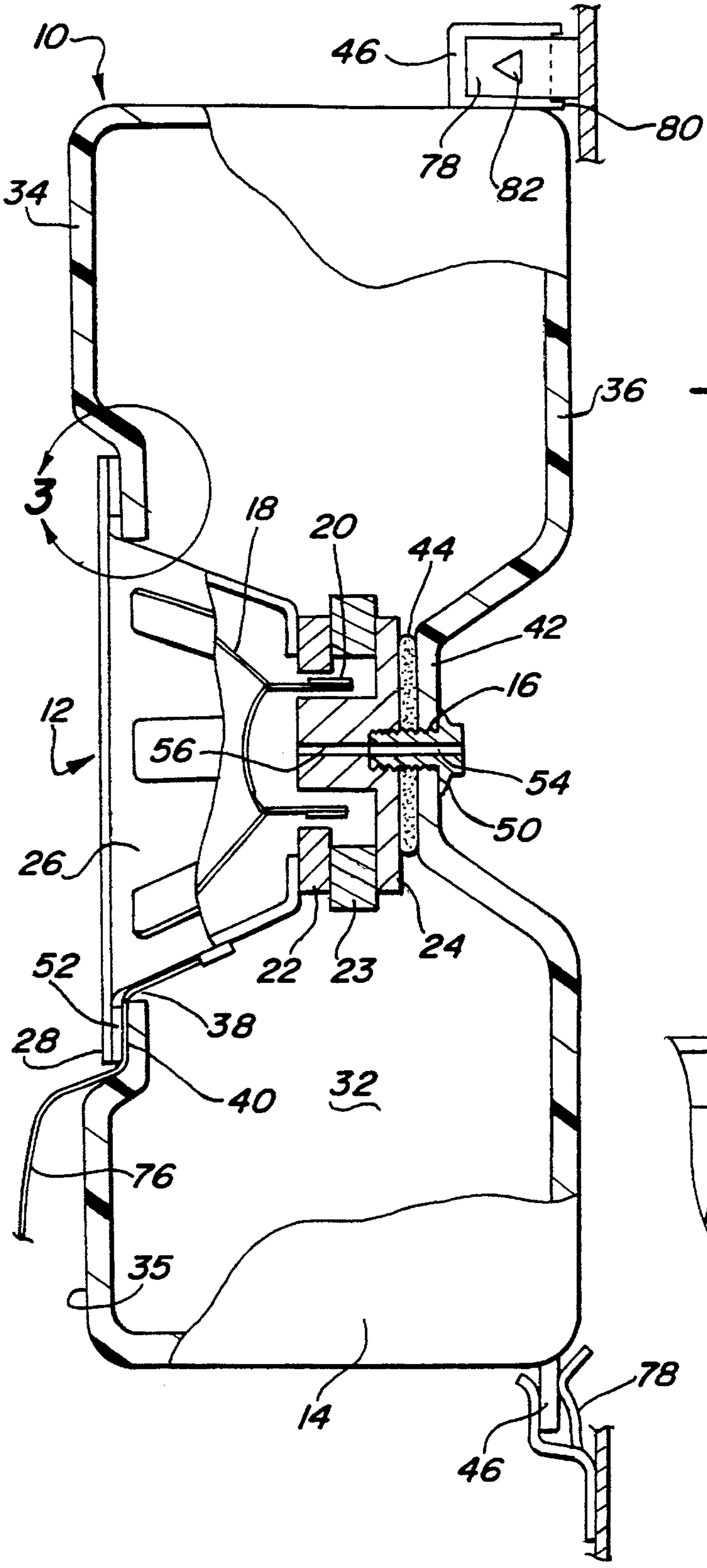
FIG. 2 is a partial cross-sectional view of the speaker assembly illustrated in FIG. 1.

As illustrated in FIG. 2, speaker assembly 10 comprises a speaker 12, a blow molded speaker enclosure 14, and a fastener 16 connecting speaker 12 to enclosure 14. Speaker 12 is a conventional moving-coil loudspeaker having a diaphragm 18, a voice-coil 20, and a magnetic circuit comprising a front plate 22, a magnet 23, and a back plate 24. Back plate 24 optionally includes a magnet housing (not shown) which surrounds the magnetic circuit. Speaker 12 further includes a frame 26 about diaphragm 18 which has a peripheral flange 28.

Speaker enclosure 14 is a generally box-shaped, hollow structure which defines acoustic cavity 32. Enclosure 14 includes a front wall portion 34 and a rear wall portion 36. Front wall portion 34 defines an opening 38 for receiving speaker 12 into acoustic cavity 32. A planar sealing surface 40 is provided about opening 38 for supporting flange 28 of frame 26. Sealing surface 40 is preferably recessed from adjacent areas of front wall portion 34 so that the front face of speaker 12 is flush with, or slightly recessed from, the outermost surface 35 of front wall portion 34. Surface 35 may then be positioned adjacent a planar trim panel (not shown).

Planar sealing surface 40 may be formed during the blow molding process by pressing a cooling plate (not shown) onto front wall portion 34. A cutting blade preferably provided on the cooling surface of the plate forms a partial cut in an area of front wall portion 34 that is knocked out in a post-mold operation to create opening 38. The size and shape of opening 38 and planar sealing surface 40 may be varied by simply changing the cooling plate and cutting blade used in the mold tool. The cooling plate provides planar sealing surface 40 with a smooth finish suitable for sealing.

Rear wall portion 36 is preferably provided with an indented portion 42, which reinforces or strengthens enclosure 14 and also contributes to sound damping within cavity 32. Indented portion 42 may be sized to abut against back plate 24 of speaker 12, forming an airtight connection therebetween. Alternatively, indented portion 42 may be spaced from back plate 24. In the latter case, an annular seal 44, preferably made of rubber or foam, is positioned between indented portion 42 and the back portion of speaker 12.

Enclosure 14 is further provided with flat attachment tabs 46 through which enclosure 14 is mounted to the vehicle. The installation of enclosure 14 into the vehicle will be described in greater detail below. Enclosure 14 is also preferably provided with a plurality of ribs 48 (see FIG. 3) on each of its sides. Ribs 48 increase the rigidity of enclosure 14 and contribute to sound wave absorption within acoustic cavity 32. Optionally, enclosure 14 may also include a flattened area (not shown) on which a dedicated amplifier may be mounted.

In general, it is desirable to design enclosure 14 such that the volume of acoustic cavity 32 is maximized within the package constraints of the installation area. When enclosure 14 is unvented and is used with automotive subwoofer speakers having a typical flange diameter of six to eight inches, the optimum volume of cavity 32 will generally be from about ten to twenty liters. Portions of the enclosure wall may be as thin as about three millimeters.

Preferred materials for enclosure 14 include virgin and regrind high density polyethylene (HDPE) and polypropylene. Mineral fillers, such as talc and mica, may be added. Other plastics having sufficient stiffness to present a low compliance to the sound waves generated within enclosure 14 may also be advantageously used.

Fastener 16 is used to connect speaker 12 to rear wall portion 36 of enclosure 14. As illustrated in FIG. 2, fastener 16 extends through indented portion 42 of rear wall portion 36 and engages back plate 24 of speaker 12. Depending on the orientation of speaker assembly 10 within the vehicle, indented portion 42 of enclosure 14 may directly support the weight of speaker 12. In other orientations, such as the one illustrated in FIG. 1, the weight of speaker 12 is carried by fastener 16, and fastener 16 is in turn supported by indented portion 42. In a preferred embodiment, fastener 16 comprises a threaded bolt and washer combination. As depicted, washer 50 may be formed integrally with the head of the bolt.

Upon fastening speaker 12 to rear wall portion 36 of enclosure 14, flange 28 is drawn towards planar sealing surface 40. A gasket 52 provided between flange 28 and sealing surface 40 is compressed, forming an airtight seal therebetween. By securing speaker 12 to both front and rear wall portions 34, 36 in this manner, speaker 12 acts as a rigid structural support for enclosure 14, fixing front wall portion 34 relative to rear wall portion 36 and thereby minimizing sound distorting vibration or flexure of enclosure 14.

In a preferred embodiment, fastener 16 has a longitudinal bore 54 extending therethrough. Bore 54 cooperates with an aligned cooling passage 56 extending through back plate 24. Bore 54 and cooling passage 56 together form a convection path through which heat energy generated within speaker 12 may be dissipated. Heat energy may also be dissipated through the body of fastener 16 which is preferably made from a thermally conductive material, such as aluminum. In the absence of these cooling mechanisms, the temperature of voice-coil 20 may rise during use, increasing the electrical resistance of the coil and decreasing its sound output.

While fastener 16 may be the only mechanism provided for attaching speaker 12 to enclosure 14, separate connecting means may also be used to attach peripheral flange 28 to planar sealing surface 40 in order to ensure a secure connection therebetween. One such connecting means, depicted in FIG. 3A, is a screw 64. Screw 64 passes through a mounting hole in peripheral flange 28 and threads into an aperture 62 provided in planar sealing surface 40. Screw 64 is preferably provided with a shoulder 66 which abuts against planar sealing surface 40. Shoulder 66 helps to prevent overtightening of screw 64 and overcompression of gasket 52. Aperture 62, which receives screw 64, need not be lined with a metal insert, enhancing the recyclability of enclosure 14. Generally from four to eight screws 64 will be used to fasten peripheral flange 28 to planar sealing surface 40.

In another embodiment of the invention, a plurality of bayonet-type retainers 68 may be used to secure peripheral flange 28 to planar sealing surface 40'. Planar sealing surface 40' is illustrated in FIG. 4 and one of the retainers 68 is depicted in FIG. 3B. Retainers 68 are fixed to and are suitably spaced about frame 26. Correspondingly spaced keyed portions 70 are provided about opening 38 in planar sealing surface 40'. Retainers 68, which extend radially outwardly from frame 26, are sized to pass through keyed portions 70 on installation of speaker 12 into enclosure 14. Upon subsequent rotation of speaker 12, retainers 68 engage an inner surface 72 of front wall portion 34. Thus, bayonet-type retainers 68 permit fast assembly of speaker 12 and enclosure 14. In cooperation with fastener 16, retainers 68 also provide a secure connection between peripheral flange 28 and planar sealing surface 40'.

Figure 3C:
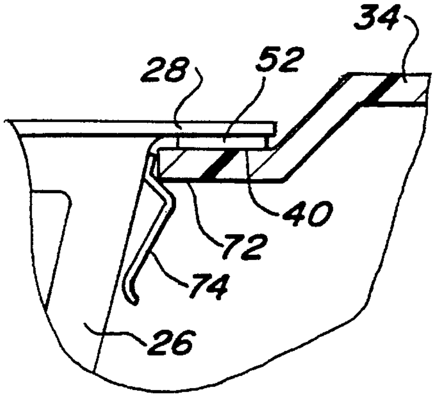
FIG. 3C is a partial cross-sectional view of the area labeled 3 in FIG. 2, showing yet another alternative embodiment of the present invention.

In yet another embodiment of the invention, a plurality of flexible clips 74 may be used to secure peripheral flange 28 to planar sealing surface 40. Flexible clips 74 are attached to and are suitably spaced about the circumference of frame 26, extending radially outwardly therefrom. One of the clips 74 is depicted in FIG. 3C. Upon insertion of speaker 12 into enclosure 14, clips 74 flex inwardly and are therefore able to pass through opening 38 in front wall portion 34. After passing through opening 38, clips 74 spring back and engage inner surface 72 of front wall portion 34. Clips 74 enable speaker 12 to be quickly snapped into enclosure 14 and cooperate with fastener 16 to provide a secure connection between flange 28 and sealing surface 40.

Speaker assembly 10 is preferably provided with a flat speaker wire 76 for connecting speaker 12 to an amplifier or other external signal source. As illustrated in FIG. 2, flat speaker wire 76 passes between peripheral flange 28 and planar sealing surface 40 for convenient insertion into enclosure 14 through opening 38. Wire 76 is sufficiently flexible to conform to the contours of opening 38. Wire 76 is also sufficiently thin in relation to gasket 52 so that when gasket 52 is compressed, gasket 52 seals around wire 76 and protects wire 76 from damage. Wire 76 is preferably positioned intermediate gasket 52 and planar sealing surface 40, but may also be positioned intermediate gasket 52 and peripheral flange 28 or through an aperture provided in gasket 52. Each pole of wire 76 is a single ribbon of metal tape. Flat wire, having a thickness of from about 0.3 mm to about 0.5 mm, is commercially available from Wire Tape Company as Wire Tape and may be used in the present invention. Since wire 76 passes through the same opening 38 as speaker 12, speaker 12 may be connected to the amplifier or other signal source and be conveniently tested for proper operation before being shipped and installed in enclosure 14. The ability to electrically connect, test, ship and install the speaker and signal source as a single unit will simplify the manufacture of automotive speaker assemblies, and significantly reduce cycle times.

As previously indicated, speaker assembly 10 is mounted to the vehicle through attachment tabs 46 provided on enclosure 14. Speaker assembly 10 may be installed in the vehicle in conventional fashion by bolting tabs 46 to the vehicle body. Alternatively, speaker assembly 10 may be mounted to the vehicle by inserting tabs 46 into clamps 78 which are fixed to the vehicle body. As illustrated in FIGS. 2 and 4, tabs 46 preferably include locating projections 80. Projections 80 ensure proper placement of tabs 46 within clamps 78 and also help prevent slippage of tabs 46 during use. Clamps 78 may also be provided with barbs 82 for locking tabs 46 in place. Speaker assembly 10 is installed in the vehicle by first inserting all of the tabs 46 projecting from one side of enclosure 14 into their respective clamps 78 and then by inserting all of the tabs 46 on the other side of enclosure 14 into their respective clamps 78.

The foregoing description presents the preferred embodiments of the present invention. Other embodiments may be possible without departing from the scope of the appended claims.

What is claimed is:

1. A speaker assembly for a motor vehicle, comprising:

a speaker having a frame and a back plate, said frame having a peripheral flange;

a blow molded speaker enclosure, having front and rear wall portions, said front wall portion defining an opening for receiving said speaker and having a planar sealing surface adjacent said opening for supporting said flange;

a gasket intermediate said flange and said sealing surface; and a fastener extending through said rear wall portion and engaging said back plate, said fastener drawing said flange towards said sealing surface such that said gasket is compressed and said speaker spaces said rear wall portion a fixed distance from said front wall portion.

2. The speaker assembly of claim 1, wherein said speaker enclosure is unvented.

3. The speaker assembly of claim 1, wherein said rear wall portion includes an indented portion strengthening said rear wall portion, said indented portion receiving said fastener and providing support for said speaker.

4. The speaker assembly of claim 1, further comprising a flat speaker wire extending into said enclosure between said flange and said sealing surface, said wire being electrically connected to said speaker.

5. The speaker assembly of claim 1, wherein said fastener has a longitudinal bore extending therethrough for cooling said speaker.

6. The speaker assembly of claim 5, wherein said back plate has a passage extending therethrough, said passage being aligned with said bore and cooperating with said bore to cool said speaker.

7. The speaker assembly of claim 1, wherein said fastener is the sole attachment mechanism provided between said speaker and said enclosure.

8. The speaker assembly of claim 1, wherein said sealing surface includes a plurality of keyed portions about said opening and said frame has a plurality of retainers attached thereto, said retainers being sized to pass through said keyed portions and engage an inner surface of said front wall portion so as to secure said flange to said sealing surface.

9. The speaker assembly of claim 1, further comprising a plurality of flexible clips attached to and extending radially outwardly from said frame, said clips being adapted to pass through said opening and engage an inner surface of said front wall portion so as to secure said flange to said sealing surface.

10. A speaker assembly for a motor vehicle, comprising:

a speaker having a frame and a back plate, said frame having a peripheral flange;

a blow molded speaker enclosure, having front and rear wall portions, said front wall portion defining an opening for receiving said speaker and having a planar sealing surface adjacent said opening for supporting said flange;

a gasket intermediate said flange and said sealing surface;

a flat speaker wire extending into said enclosure between said flange and said sealing surface, said wire being electrically connected to said speaker; and a fastener extending through said rear wall portion and engaging said back plate, said fastener drawing said flange towards said sealing surface such that said gasket is compressed and said speaker spaces said rear wall portion a fixed distance from said front wall portion, said fastener having a longitudinal bore extending therethrough for cooling said speaker.

11. The speaker assembly of claim 10, wherein said back plate has a passage extending therethrough, said passage being aligned with said bore and cooperating with said bore to cool said speaker.

12. The speaker assembly of claim 10, wherein said speaker enclosure is unvented.

13. The speaker assembly of claim 10, wherein said rear wall portion includes an indented portion strengthening said rear wall portion, said indented portion receiving said fastener and providing support for said speaker.

14. The speaker assembly of claim 10, wherein said fastener is the sole attachment mechanism provided between said speaker and said enclosure.

15. The speaker assembly of claim 10, wherein said sealing surface includes a plurality of keyed portions about said opening and said frame has a plurality of retainers attached thereto, said retainers being sized to pass through said keyed portions and engage an inner surface of said front wall portion so as to secure said flange to said sealing surface.

16. The speaker assembly of claim 10, further comprising a plurality of flexible clips attached to and extending radially outwardly from said frame, said clips being adapted to pass through said opening and engage an inner surface of said front wall portion so as to secure said flange to said sealing surface.

17. A speaker assembly for a motor vehicle, comprising:

a speaker having a frame, said frame having a peripheral flange;

a speaker enclosure, having a front wall portion, said front wall portion defining an opening for receiving said speaker and having a planar sealing surface adjacent said opening for supporting said flange; and a flat speaker wire extending into said enclosure between said flange and said sealing surface, said wire being electrically connected to said speaker.

18. The speaker assembly of claim 17, further comprising a gasket intermediate said flange and said sealing surface protecting said wire from damage.

* * * * *